United States Patent [19]

Weimer

[11] Patent Number: 4,607,286
[45] Date of Patent: Aug. 19, 1986

[54] REMOVAL OF LINE SELECTION ARTIFACTS FROM TRACE PORTIONS OF LINE TRANSFER CCD IMAGER VIDEO OUTPUT SIGNALS

[75] Inventor: Paul K. Weimer, Mercer County, N.J.

[73] Assignee: RCA Corporation, Princeton, N.J.

[21] Appl. No.: 688,982

[22] Filed: Jan. 4, 1985

[51] Int. Cl.[4] .............................................. H04N 3/14
[52] U.S. Cl. ...................................... 358/213; 357/24
[58] Field of Search .................. 358/213, 41, 167; 357/24 LR

[56] References Cited

U.S. PATENT DOCUMENTS

| | | | |
|---|---|---|---|
| 3,967,055 | 6/1976 | Teer et al. | 358/213 |
| 3,995,107 | 11/1976 | Woywood | 358/213 |
| 4,000,511 | 12/1976 | Kenney | 358/167 |
| 4,536,795 | 8/1985 | Hirota et al. | 358/213 |
| 4,577,232 | 3/1986 | Hynecek | 358/213 |

Primary Examiner—Gene Z. Rubinson
Assistant Examiner—Stephen Brinich
Attorney, Agent, or Firm—Joseph Tripoli; George E. Haas; Allen L. Limberg

[57] ABSTRACT

There is electrostatic coupling of the forward clocking signals used in a CCD imager of line transfer type to the underlying bulk semiconductor and then to the output charge sensing stage. Changes in forward clocking signal application during the line selection process in the image register tend to introduce transient disturbances leaving visible artifacts in television pictures reconstructed from the video signals generated from the CCD imager output signal samples. This tendency can be obviated in CCD imagers of line transfer type by introducing additional clocked delay to place the disturbances in the line retrace interval. The disturbances can then be removed from video signals by line retrace blanking.

9 Claims, 8 Drawing Figures

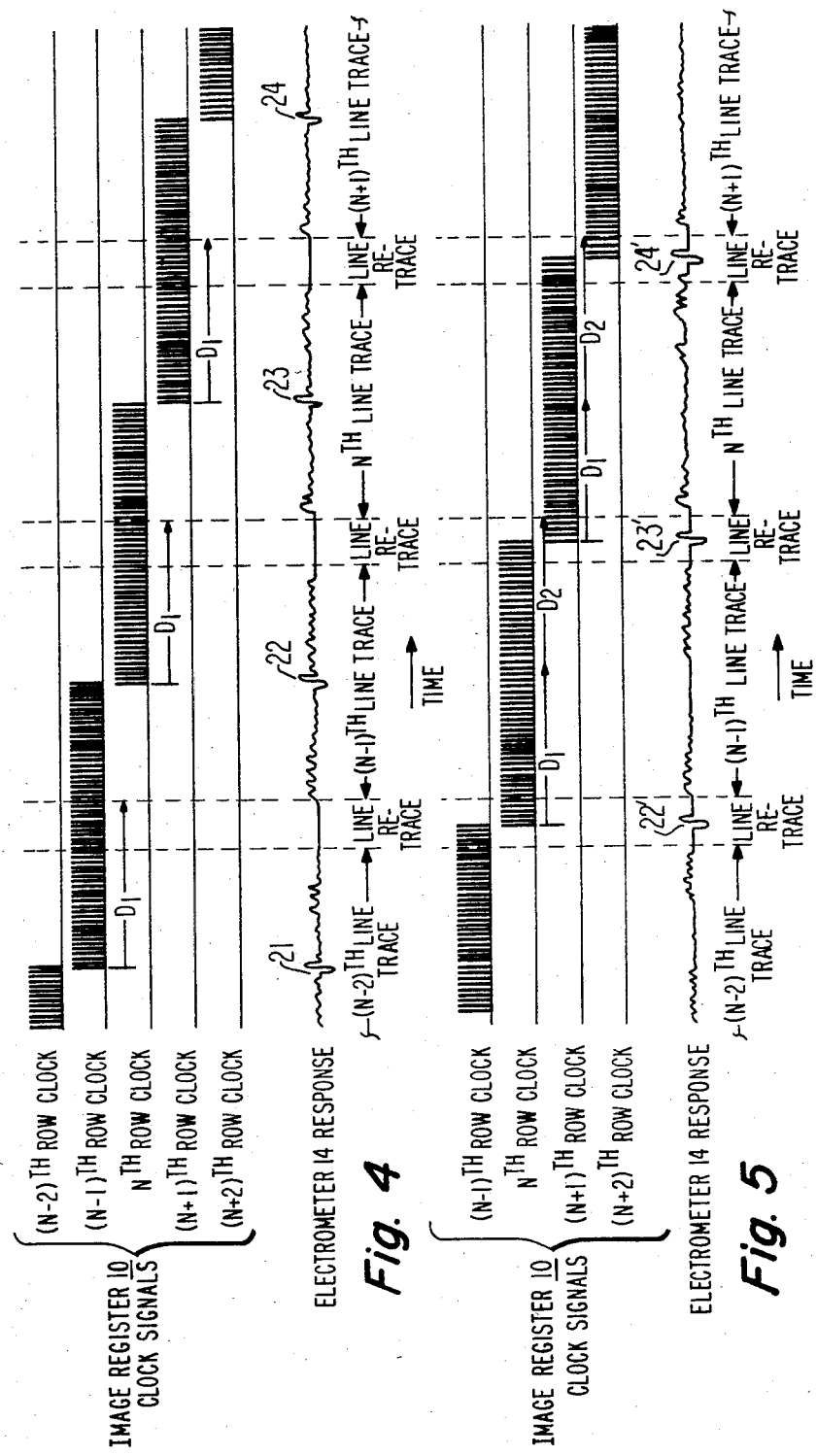

REMOVAL OF LINE SELECTION ARTIFACTS FROM TRACE PORTIONS OF LINE TRANSFER CCD IMAGER VIDEO OUTPUT SIGNALS

The present invention relates to charge-coupled-device (CCD) imagers of line transfer type and, more particularly, to the removal of line selection artifacts from line trace portions of their video output signals.

BACKGROUND OF THE INVENTION

The line transfer type of CCD imager has an image register comprising a parallel array of charge transfer channels arranged for charge transfer in a direction parallel to the direction of scanning of an image projected onto the array. During each field scanning interval, each charge transfer channel may be successively selected for being read out, presuming no field-to-field line interlace is used. The selected charge transfer channel receives a dynamic forward clocking signal to operate it as a CCD shift register, while the other charge transfer channels receive a static clocking signal. Every charge transfer channel receives static clocking signal for its respective image integration interval, which lasts for one frame time prior to the selection of that channel for read out. This static clocking signal establishes an alternating succession of potential energy barriers and wells in the charge transfer channel during its respective image integration interval, and charge carriers generated by photoconversion in the charge transfer channel and the underlying bulk semiconductor accumulate in the wells to form charge packets. The amplitude of each charge packet is representative of the intensity of an image element, or pixel, associated with the potential energy well in which the charge packet is accumulated.

The selected charge transfer channel is read out through a CCD output register to charge sensing stage, which senses the amplitudes of the charge packets sequentially read out from the dynamically clocked charge transfer channel. Typically, this charge sensing stage is an electrometer comprising an insulated-gate field effect transistor having its gate electrode connected to a floating diffusion in the output of the CCD multiplexer and otherwise being connected as a source- or drain-follower. The CCD output register may be a CCD shift register, having its charge transfer channel at right angle to the charge transfer channels in the image register. In such case, the successive charge transfer stages of the output register can be successively side-loaded with a successive line of charge packets from a respective one of the image register charge transfer channels. The shift register output port supplies to the charge sensing stage, in sequence, the charge packets from each charge transfer channel in the image register. Alternatively, the CCD output register may be a "charge funnel", a charge transfer channel wide enough at its input port to connect to the parallelly arranged output ports of all the charge transfer channels in the image register, and narrow enough at its own output port to supply to a small charge sensing stage charge packets of appreciable amplitude variation responsive to variation in radiant energy image intensity. Other alternative CCD multiplexers each comprise a plurality of charge funnels with input ports in parallel, each connected to the parallelled output ports of a band of image register charge transfer channels. The output ports of the charge funnels in certain of these CCD multiplexers go to separate charge sensing stages. The output ports of the charge funnels in certain others of these CCD multiplexers are connected by respective charge transfer channels to the input ports of a charge merging stage, the output port of which subsequently supplies charge packets to a charge sensing stage.

A problem that plagues line transfer type CCD imagers is the appearance of one or two line artifacts in the television picture constructed from the video signal originating from the image. Each line artifact is caused by electrostatic coupling of the forward clocking signal being selectively applied to one or two charge transfer channels in the image register, which electrostatic coupling is to the charge sensing stage via shared capacitance to the underlying substrate. The starting or stopping of such forward clocking signal affects the sensed charge to cause an electrical disturbance or glitch in the scan line. The glitches in successive scan lines form, in the aggregate, a line artifact. If the forward clocking signals of successive line scans start and stop simultaneously—i.e., if each charge transfer channel in the image register is clocked for a full line interval—a single line artifact will appear in the television picture. Clocking the charge transfer channels in the image register for a shorter time—i.e., just during line trace interval—may result in two line artifacts appearing in the television picture. The line artifacts are normal to the direction of line scan in line-transfer CCD imagers using charge-funnel CCD multiplexer circuitry to connect the image register to their charge sensing stages. The line artifacts are skewed in line-transfer CCD imagers using side-loaded CCD shift registers with charge transfer channels at right angles to those in their image registers for connecting their image registers to their charge sensing stages.

SUMMARY OF THE INVENTION

The present invention is embodied in a line-transfer CCD imager including additional CCD shift register circuitry for introducing extra delay before its charge sensing circuit. This extra delay is chosen to adjust the total delay from its image register to its charge sensing stage to be substantially equal to an integral number of scan lines. Then switching on and off the dynamic clocking to image register charge transfer channels during line retrace intervals does not introduce artifacts in a television picture constructed from the video signal samples supplied from the CCD imager charge sensing circuit. In line-transfer CCD imagers using a charge funnel as output register, this is done with extra delay invariant from line to line. In line transfer CCD imagers using a side-loaded CCD shift register as output register, the extra delay is adjusted from line to line.

BRIEF DESCRIPTION OF THE DRAWING

FIG. 4 is a timing diagram of a line transfer CCD imager using a charge funnel and not employing the invention.

FIG. 5 is a timing diagram of the FIG. 2 line transfer CCD imager.

DETAILED DESCRIPTION

Figure 1:
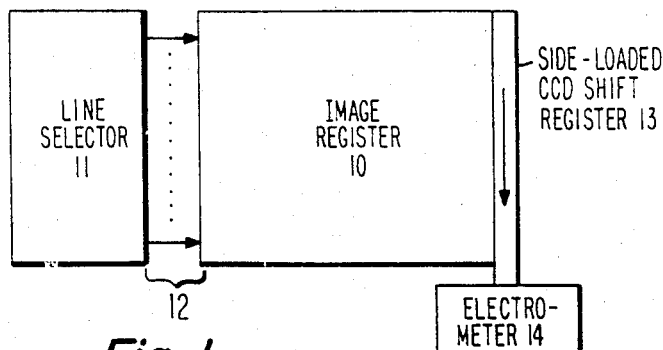
FIG. 1 is a block diagram of a prior art CCD imager of line transfer type, using a side-loaded CCD register as an output register for connecting each of the parallelled output ports of the charge transfer channels in its image register to the input port of its output charge sensing stage.

FIG. 1 shows a prior art line-transfer CCD imager having certain features in common with the improved line-transfer imagers embodying the invention. The FIG. 1 CCD imager has an image register 10 comprising a plurality of paralleled charge transfer channels of equal length running from its left edge to its right. An inverted radiant energy image (not shown) is projected into image register 10 either through its top, gate-electrode-bearing surface or through its opposing, bottom surface. In the latter case (presently preferable and herein after presumed to be used) the underlying substrate of semiconductor material is thinned to reduce attenuation of the radiant energy reaching the image register 10 charge transfer channels. Radiant energy image elements, or pixels, are photoconverted in the charge transfer channels themselves or adjacent semiconductive material; and the charge is collected in the potential energy wells induced under selected gate electrodes in the charge transfer channels of image register 10. Line transfer imagers insofar as the invention is concerned can include those imagers (also susceptible to the line selection artifact problem) which integrate photocharge in photosensors outside the CCD charge transfer channels of the image register, then transfer those charge packets into respective charge transfer stages in the CCD charge transfer channels of the image register via row transfer gates, as well as those imagers which integrate photocharge in the respective charge transfer stages in the CCD charge transfer channels of the image register themselves. Except when selected for being read out from, each charge transfer channel in image register 10 has a static clocking signal applied in a plurality of phases to successive gate electrodes crossing over that channel. This static clocking signal defines the locations of potential energy barriers between the potential energy wells in the charge transfer channel and thus establishes the pixel boundaries.

A line selector 11 selectively applies via connections 12 dynamic clocking signals to the charge transfer channels in image register 10, successively, one channel at a time. (Or, where one type of field to field line interlace is used, dynamic clocking signals are applied to a pair of adjacent channels at a time, and the pairs of charge packets serially supplied from them are combined prior to their application to the output register circuitry following the image register 10.) The bottom charge transfer channel in image register 10, in which charge packets descriptive of the intensity of image elements in the "top" line of elements of the inverted radiant energy image appear, is read in the first line selection period. In subsequent line selection periods charge-transfer channels ever nearer the top of image register 10 are read, to scan the inverted radiant energy image from "top" to "bottom". Dynamic clocking signals are applied for a period of time sufficient to read out the entire line of charge packets accumulated during the frequency image integration interval. The selected charge transfer channel is supplied dynamic, forward clocking signal for at least the trace period of line scan time and for up to the full duration of line scan. Normally line scan is in a horizontal direction in most television systems and then the line scan interval is termed "1H" time duration. 1H is a normalized unit of time measurement. In broadcast television 1H is about 63.5 microseconds and line retrace may range from 0.16H to 0.18H. It is convenient to think of line retrace as being (1/6)H in duration and of line trace as being (5/6)H in duration when such standards are followed.

The FIG. 1 CCD imager has a charge sensing output stage shown as an electrometer 14. Electrometer 14 commonly comprises a floating diffusion located near the output port of a CCD, which floating diffusion galvanically connects to the gate electrode of an insulated-gate field-effect transistor connected in common-drain or common-source amplifier configuration. The floating diffusion is periodically reset to known potential to effect dc-restoration. The electrometer field effect transistor typically has another field effect transistor amplifier connected in cascade thereafter.

The FIG. 1, FIG. 2, FIG. 3 and FIG. 6 CCD imagers use different output register circuitry to connect the paralleled output ports of the charge transfer channels in image register 10 to the input port of electrometer 14, and their respective line selectors operate with timing to suit the delay or latency time through the different types of output register circuitry. In FIG. 1 the output register circuitry consists of a CCD shift register 13 having its output port connected to the input port of electrometer 14. The successive charge transfer stages of CCD shift register 13 are arranged for being sideloaded from a respective image register 10 charge transfer channel (or pair of such channels in certain line interlace schemes) during its (or their) being selectively read out. CCD shift register 13 is forward clocked in synchronism with the charge transfer channel(s) in image register 10 selected for read-out, to convey the charge samples shifted out of image register 10 to the input port of electrometer 14. The read-out of the lower charge transfer channels in image register 10, as the top of the inverted radiant energy image is scanned line-by-line, is advanced over a shorter portion of the full length of CCD shift register 13 than is the read-out of the upper charge transfer channels in imager register 10, as the bottom of the inverted radiant energy image is scanned line-by-line. This tends to introduce a delay in line read-out from image register 10 that becomes progressively longer with each line advance, which tendency exhibits itself in the display as diagonal skew in the direction of line advance.

To prevent the skewing of displayed image, line selector 11 has in prior practice of the inventor been modified so that the successive line read-outs of the image register 10 charge transfer channels are begun with a progressively increasing lead that compensates against the tendency for progressively increasing lag, or delay, in charge packet reaching the input port of electrometer 14. This introduction of progressively increasing lead in charge transfer channel read-out exacerbates the problem of image-register line-selection artifacts appearing in a television image reconstruction from the CCD imager output signal, because the path of the artifact being diagonal crosses a greater percentage of the display screen width. A line-selection artifact is longer than (1/6) H in the scanning line direction, so it cannot be confined to the line retrace interval by introducing fixed delay. As previously noted, continuing to dynamically clock a selected charge transfer channel for a full line interval is advantageous in that only one line selection artifact, not two parallel ones, is generated.

In U.S. Pat. App. Ser. No. 650,615 filed Sept. 14, 1984, entitled "TDM-INPUT ELECTROMETER, AS IN A LINE TRANSFER CCD IMAGER, USING A CHARGE FUNNEL", and assigned to RCA Corporation, P.K. Weimer describes an alternative type of line transfer CCD imager in which the parallelled output channels connect to the input port of a CCD transfer device called a charge funnel, the output port of which connects to the output charge sensing stage. The delays from the output ports of all the image register charge transfer channels to the input port of the charge sensing stage are equal to each other. The image-register line-selection artifact is normal to the scan lines, so its path crosses only a few pixels width on the display screen. However, the time delay through the charge funnel is normally much less than 1H, which undesirably causes the line-selection artifact to make its appearance in the picture portions of the video signal. Consider now a modified form of this alternative type of line transfer imager, which modified form embodies the invention.

Figure 2:
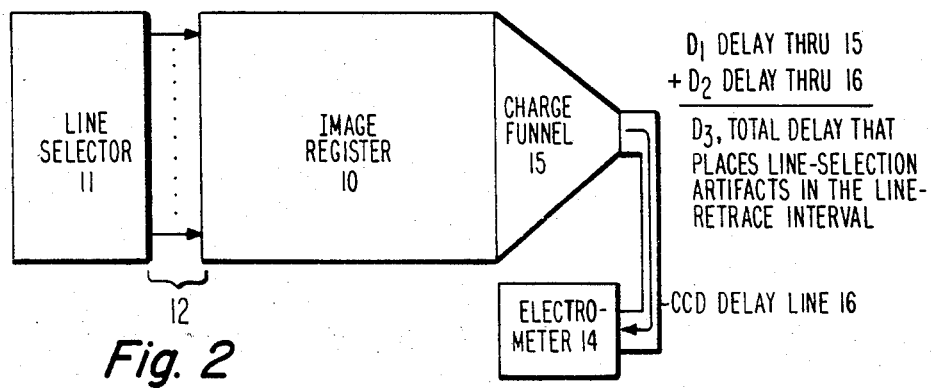
FIG. 2 is a block diagram of a CCD imager of line transfer type, using a charge funnel followed by a CCD shift register in its output register circuitry. In accordance with the invention, this shift register introduces sufficient delay between the image register and output charge sensing stage to remove image-register line-selection artifacts from the line scan portions of the video signal generated from the CCD imager output signal.

In the FIG. 2 CCD imager, the output register circuitry for connecting the parallelled output ports of the charge transfer channels in image register 10 to the input port of electrometer 14 comprises the cascade connection of a charge funnel 15 and a succeeding CCD shift register 16. These charge transfer structures are continuously forward clocked at the pixel scan rate through the scanning of the image over a portion of the field time, and for a time after the image has been scanned, to complete the transfer of the charge packets descriptive of the intensity of image elements through these charge transfer structures. The charge funnel 15 is a CCD charge transfer channel, wide enough at its input port to connect across the parallelly arranged output ports of all the charge transfer channels in image register 10, and narrow enough at its output port to increase potential variation responsive to charge packet variation to amplitudes of the same order as those at the output ports of the charge transfer channels of image register 10. These amplitudes are sufficient to maintain electrometer 14 response about what it would be in the FIG. 1 CCD imager. Charge funnel 15 is forward clocked continuously at the same rate as that of the image register 10 charge transfer channel(s) selected for read out, which forward clocking rate is identifiable as pixel scan rate along the scan line.

Rather than applying charge packets from the output port of charge funnel 15 directly to the input port of electrometer 14, however, the application is made through a CCD shift register 16 in a departure from previous practice. The delay or latency time of charge funnel 15, the time required for a charge packet to be advanced through charge funnel 15 when forward clocked at the rate associated with pixel rate scan, has a value $D_1$ which typically is a fraction of 1H in excess of (1/6)H. CCD shift register 16 is forward clocked in synchronism with charge funnel 13 and has a delay or time $D_2$ which sums with $D_1$ to provide a delay $D_3$ substantially equal to 1H. That is, $D_3$ is between 1H and 1H as augmented by the line retrace interval. $D_3$ is between 1H and (7/6)H for television using broadcast standard or certain related standards. Where image register 10 charge transfer channels are dynamically clocked for only a line trace duration, $D_3$ must be exactly 1H to keep both line artifacts in the line retrace interval of electrometer 14 output signal. Where image register 10 charge transfer channels are dynamically clocked for a full 1H line time, $D_3$ is preferably longer than 1H by an interval somewhat shorter than line retrace interval, so that glitches are well over before line trace resumes in electrometer 14 output signal. That is, changes in the image register charge transfer channel selection for read-out will occur earlier in the line retrace interval.

FIG. 4 is a timing diagram of a CCD imager using a charge funnel in its output register circuitry, but not using a CCD delay line 16 to build out the delay in the output register circuitry to substantially equal 1H or a multiple thereof. Except for no CCD delay line 16, the imager is exactly like that of FIG. 2. The clocking signals for selected rows—i.e., the $(N-2)^{th}$, $(N-1)^{th}$, $N^{th}$, $(N+1)^{th}$ and $(N+2)^{th}$ rows—of image register 10 are shown. The beginning of the dynamic forward clocking of an image register row is advanced by an interval $D_1$ before electrometer 14 response to that row is to begin, to compensate for the delay $D_1$ through charge funnel 15. $D_1$ may have to be longer than line retrace interval, say about half 1H. Then, each transition between dynamic forward clocking being applied to one row of image register 10 and the next row falls within line trace interval in electrometer 14 response, giving rise to glitches 21, 22, 23, 24 etc. in the picture portions of electrometer 14 response. For example, transition in dynamic forward clocking from the $(N-1)^{th}$ row to the $N^{th}$ row in image register 10 generates glitch 23 during $N^{th}$ line trace in electrometer 14 response. On a television screen, the glitch in each line appears as an artifact perpendicular to line scan.

FIG. 5 is a timing diagram of the FIG. 2 CCD imager with CCD delay line 16 included for building out, to substantially 1H, the delay in the output register circuitry comprising charge funnel 15 and CCD delay line 16. The dynamic forward clocking of successive rows of image register 10 is advanced to compensate for the combined delay $D_3$, comprising $D_1$ of charge funnel 15 and $D_2$ of delay line 16. $D_3 = D_1 + D_2$ is made to be at least 1H and preferably longer by less than line retrace duration. This shifts to the line retrace intervals the glitches 22', 23', 24' arising from charge in the application of dynamic forward clocking signals to image register 10. For example, glitch 23', associated with the dynamic forward clocking of the $N^{th}$ row of image register 10 being discontinued and that of the $(N+1)^{th}$ row being begun, falls in the line retrace interval prior to the $N^{th}$ line trace in electrometer 14 response.

Figure 3:
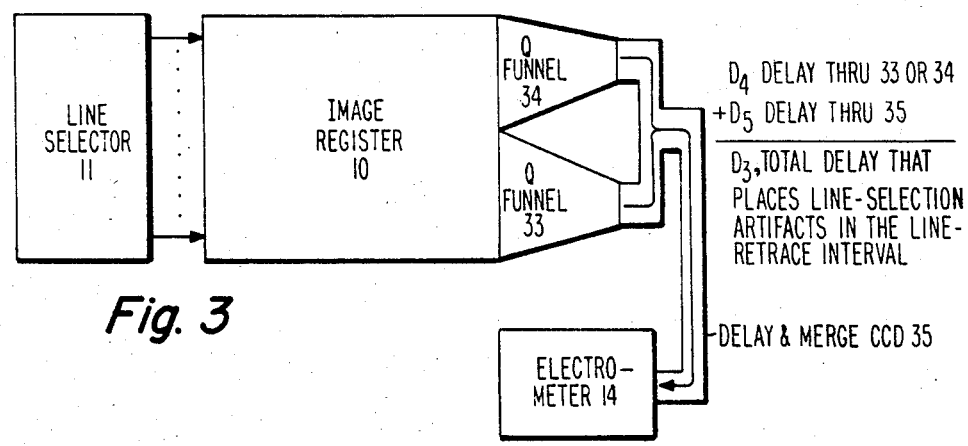
FIG. 3 is a block diagram of a CCD imager of line transfer type employing plural charge funnels in its output register circuitry and embodying the invention.

FIG. 3 line transfer CCD imager differs from that of FIG. 2 in that charge funnel 15 is replaced by a pair of shorter-delay charge funnels 33 and 34 with parallelly aligned input ports. Charge funnels 33 and 34 are continuously forward clocked at pixel scan rate throughout picture scan transmission through them. If the output ports of charge funnels 33 and 34 connected to the input ports of respective electrometers, the delay $D_4$ for passage of a charge packet through either charge funnel 33 or 34 could be made short enough to avoid the line-selection glitches falling during line trace. Matching the response characteristics of two separate charge sensing stages, however, is notoriously hard to do. Accordingly, it is desirable to use a CCD structure 35 to bring the charge packets from the output ports of charge funnels 33 and 34 together via respective CCD charge transfer channels operated as shift registers, continuously forward clocked at pixel scan rate throughout picture scan transmission through them, and merge the charge transfer channels to supply the input port of a single charge sensing stage, or electrometer 14. The delay $D_5$ in either of these paths through CCD structure 35 should sum with $D_4$ to equal $D_3$, which is 1H long or somewhat longer. CCD structure 35 with its delay $D_5$ is preferably constructed so as to provide as much of $D_5$ as possible by shift register operation of an extended charge transfer channel, following the merging of the charge transfer channels from the outputs of charge funnels 33 and 34. This extended charge transfer channel is continually forwarded clocked at pixel scan rate, at least throughout picture scan transmission through it.

Figure 6:
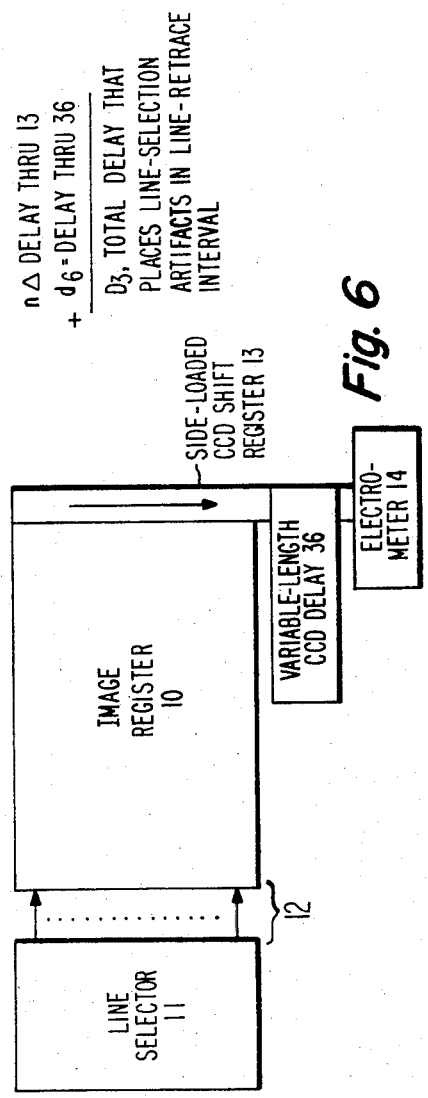
FIG. 6 is a block diagram of a CCD imager of line transfer type, its output register circuitry using a sideloaded CCD register followed by a variable-delay CCD register and embodying the invention.
Figure 7:
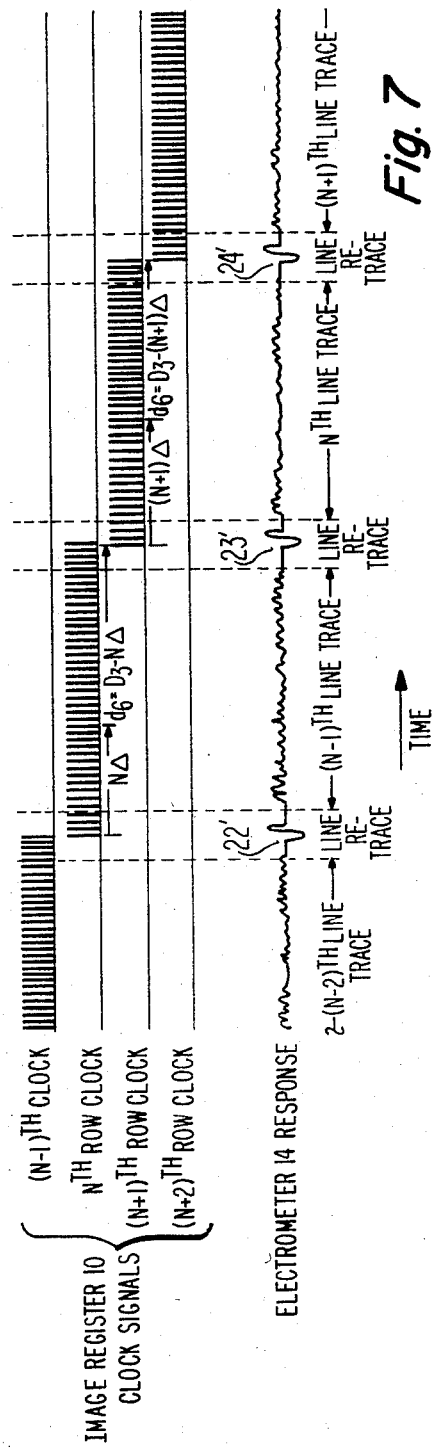
FIG. 7 is a timing diagram of the FIG. 6 line transfer CCD imager.

FIG. 6 shows how a CCD imager using a side-loaded CCD shift register 13 in its output register circuitry can be modified to embody the invention. A variable-length CCD delay line 36 is interposed between the output port of CCD shift register 13 and the input port of electrometer 14. The delay $d_6$ provided by delay line 36 augments the delay through CCD shift register 13 to provide the same overall delay $D_3$ between each image register 10 charge transfer channel output port and the input port of electrometer 14. $D_3$ is again between 1H in duration and 1H plus line retrace time in duration. Supposing a delay Δ between each of the side-loading input ports of CCD shift register 13, the delay through 13 will have a value nΔ where n is the consecutive ordinal number of the image register 10 charge transfer channel or "row". The delay $d_6$ that delay line 36 provides to charge packets read from the $n^{th}$ row will have a value $D_3$−nΔ. So, as shown in FIG. 7, line-selection glitches 22', 23', 24' etc. will, in accordance with the invention, fall in line retrace intervals. That is, each change in image transfer channel selection for read-out will occur during the line retrace interval in the FIG. 6 imager video output signal.

Figure 8:
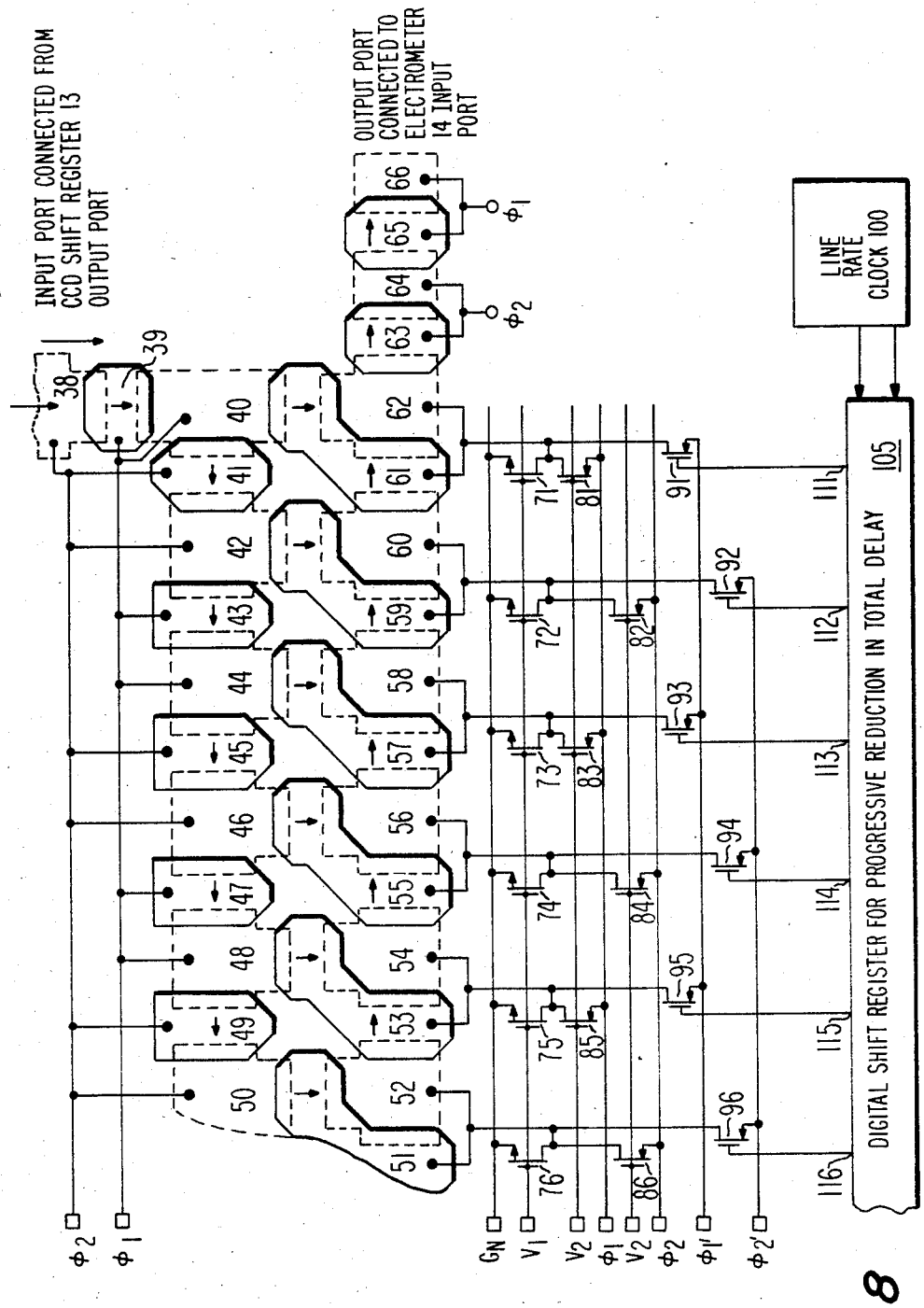
FIG. 8 is a schematic diagram of a portion of a variable length CCD delay line suitable for use in the FIG. 6 CCD imager.

FIG. 8 shows a portion of a variable-length CCD delay line as may be used in element 36 in the FIG. 6 CCD imager. In most instances $d_6$ will range upward from a non-zero value, so this FIG. 8 variable length delay line will have to be cascaded with a fixed-delay CCD delay line. The fixed-delay CCD delay line may precede or succeed the FIG. 8 variable-length delay line in the cascade, or may be split between the two locations.

The FIG. 8 variable-length CCD delay line uses two-phase clocking. Storage gate electrodes (with even ordinal numbering 38–66) are located in a first polysilicon layer closer to the surface of the semiconductor substrate and are shown in dashed outline. Transfer gate electrodes (with odd ordinal numbering 39–65) are located in a second polysilicon layer further from the surface of the semiconductor substrate and are shown in solid outline. The application of a gate electrode potential to a storage gate electrode and an overlapping transfer gate electrode will result in a potential energy barrier under the transfer gate electrode, because of its being less proximate to the substrate than the storage gate electrode; and this potential energy barrier is used to forestall charge flow in the direction from the storage gate electrode towards the transfer gate electrode, overcoming the problem of bidirectional charge flow inherent in two-phase CCD clocking.

Responsive to two-phase clocking signal voltages $\phi_1$, and $\phi_2$, charge packets are transferred from under storage gate electrode 38 over the potential energy barrier induced under transfer gate electrode 39 to under storage gate electrode 40 at the input port of the FIG. 8 variable-length CCD delay line. Storage gate electrode 38 is the last storage gate electrode in CCD shift register 13 (assuming there is no fixed-delay CCD delay line building out from shift register 13). A first charge transfer channel underlies gate electrodes 40–50 and underlies further gate electrodes, not shown, to the left of gate electrode 50. A second charge transfer channel underlies another set of gate electrodes, also not shown, to the left of gate electrode 51 and underlies gate electrodes 51–66. The output port of this second charge transfer channel is at storage gate electrode 66 and connects to electrometer 14 input port, either directly or through a fixed-delay CCD delay line. The succession of storage and transfer gate electrodes overlying the first charge transfer channel is two-phase clocked to transfer charge packets to the left, and the succession of storage and transfer gate electrodes overlying the second charge transfer channel is two-phase clocked to transfer charge packets to the right.

The continuous application of two-phase clock signals to the gate electrodes 40–50 etc. overlying the first charge transfer channel is conventional. The application of two-phase clock signals to the gate electrodes (including 51–62) overlying the second charge transfer channel is carried out in a novel manner, which allows the diversion of charge packets from the first charge transfer channel to the second charge transfer channel at a different point each scan line to adjust the length of delay between the input and output ports of the FIG. 8 variable-length CCD delay line.

The clocking arrangement to do this includes a number of constant-current n-channel field effect transistors 71–76 etc. biased as loads to ground potential GN. These loads tend to pull down to ground potential GN the voltage applied to respective storage-gate-electrode transfer-gate-electrode point overlying the second charge transfer channel, absent the application of other potential to the pairs.

P-channel field effect transistors 81, 83, 85 etc. connected as common-gate-amplifiers receive $\phi_1$ at their source electrodes to clamp to positive-going excursions of $\phi_1$ the CCD gate electrodes to which their drain electrodes connect. P-channel field effect transistors 82, 84, 86 etc. connected as common-gate-amplifiers receive $\phi_2$ at their source electrodes to clamp to positive-going excursions of $\phi_2$ the CCD gate electrodes to which their drain electrodes connect. Thus, $\phi_1$ and $\phi_2$ clock voltages are applied to the gate electrodes 51–62 overlying the second charge transfer channel, except at the point of charge transfer from the first charge transfer channel.

A line rate clock 100 causes a relatively less positive ONE output condition to be advanced from left to right in the successive signal transfer stages of a digital shift register 105, which otherwise store a relatively positive ZERO condition. Digital shift register 105 may be of CCD construction, for example. The propagation of the ONE output condition among the outputs of digital shift register 105 is done from left to right, presuming the image register 10 of the FIG. 6 CCD imager to be read out row by row starting with side-loading the last charge transfer stage of CCD shift register 13 with the first row read out, the penultimate charge transfer stage of CCD shift register 13 with the second row read out, etc.

Consider operation when the fifth from last row of image register 10 is being read out. Output 116 of digital shift register 105 is the sole one of its outputs in the relatively less positive ONE output voltage condition. This conditions p-channel FET 96 to be conductive on positive excursions of a clock voltage $\phi_2'$ applied to its source electrode and to the source electrodes of alternate ones of the other ones of the p-channel FET's 91-96 etc. The gate electrodes of these p-channel FET's connect to outputs 111-116 etc. of digital shift register 105 to receive relatively more positive ZERO output voltages. These voltages condition these FET's to be non-conductive, so as not to alter the $\phi_1$ and $\phi_2$ potentials placed on the CCD gate electrodes to which their drain electrodes respectively connect. $\phi_2'$ and $\phi_2$ have their relatively negative excursions and their relatively positive excursions in like phasing. The positive excursions of clock voltage $\phi_2'$, applied to CCD gate electrodes 51 and 52 from the drain electrode of FET 96 biased for conduction, are substantially more positive than the positive excursions of $\phi_2$. So the charge packets transferred under storage gate electrode 50 in the first charge transfer channel, when $\phi_2$ clock voltage becomes more positive, transfer to under the substantially more positive storage gate electrode 52 in the second charge transfer channel, rather than continuing to propagate down the first charge transfer channel.

Consider operation during the next scan line, when the fourth from the last row of CCD shift register 13 is being read out. The delay through the variable-length CCD delay line of FIG. 8 is to be shortened by one charge transfer stage. Output 115 of digital shift register 105 is the sole one of its outputs 111-116 etc. in the relatively less positive ONE output voltage condition. These output voltages applied to respective ones of the gate electrodes of the p-channel FET's 91-96 etc. condition all of them to be non-conductive except FET 95, the gate electrode of which receives the less positive ONE output voltage. FET 95 conducts to apply to CCD gate electrodes 53 and 54 the potential $\phi_1'$ applied to the source electrodes of alternate ones of the p-channel FET's 91-96 etc. $\phi_1'$ and $\phi_1$ have their relatively negative excursions and their relatively positive excursions in like phasing. The positive excursions of the clock voltage $\phi_1'$ are substantially more positive than those of the clock voltage $\phi_1$. So when $\phi_1$ applied to CCD gate electrodes 47 and 48 goes more positive than $\phi_2$ applied to CCD gate electrodes 45 and 46, to transfer a charge packet from under storage gate 46 to under storage gate 48, the still more positive $\phi_1'$ voltage applied to CCD gate electrodes 53 and 54 causes the transfer of the charge packet to continue to under storage gate electrode 54. That is, the charge packet transfers out of the first charge transfer channel under gate electrodes 40-50 to the second charge transfer channel under gate electrodes 51-66.

When the third from last row of CCD shift register 13 is being read out, the relatively less positive ONE condition has been shifted in digital shift register 105 to output 114. FET 94 is conditioned for conduction to apply $\phi_2'$ to CCD gate electrodes 55 and 56. Charge transfer between the first and second charge transfer channels takes place between positions under storage gate electrodes 46 and 56 to shorten the length of the FIG. 8 CCD delay line another stage.

When the second from last row of CCD shift register 13 is being read out, the relatively less positive ONE condition has been shifted in digital shift register 105 to output 113. FET 93 is conditioned for conduction to apply $\phi_1'$ to CCD gate electrodes 57 and 58. Charge transfer between the first and second charge transfer channels takes place between positions under storage gate electrodes 44 and 58 to shorten the length of the FIG. 8 CCD delay line another stage.

When the next to last row of CCD shift register 13 is being read out, the relatively less positive ONE condition has been shifted in digital shift register 105 to output 112. FET 92 is conditioned for conduction to apply $\phi_2'$ to CCD gate electrodes 59 and 60. Charge transfer between the first and second charge transfer channels takes place between positions under storage gate electrodes 42 and 60 to shorten the length of the FIG. 8 CCD delay line another stage.

When the last row of CCD shift register 13 is being read out, the relatively less positive ONE condition has been shifted in digital shift register 105 to output 111. FET 91 is conditioned for conduction to apply $\phi_1'$ to CCD gate electrodes 61 and 62. Charge transfer between the first and second charge transfer channels takes place between positions under storage gate electrodes 40 and 62 to shorten the length of the CCD delay line another stage.

What is claimed is:

1. A method for suppressing, in the line scan portion of video signal based on the video samples supplied from the output charge sensing stage of a CCD imager of line transfer type, the artifacts attributable to line selection in the image register electrostatically coupling to the output charge sensing stage of the CCD imager via shared capacitance to the CCD imager substrate, said method comprising the steps of:
   selecting lines of video samples to be supplied from said image register;
   transferring said selected lines of video samples from said image register in a path towards said output charge sensing stage in a manner such that the line selection artifacts occur in recurrent portions of the lines scan intervals, which recurrent portions define in the time domain a spatial band normal to the direction of line scan no wider than that spatial band as would be associated with the line retrace interval; and
   providing a delay to said lines of video samples in the transfer path towards said output charge sensing stage by an amount so as to place said spatial band in which line selection artifacts occur in a portion of the corresponding time domain that is within that portion of the time domain defined by the line retrace intervals in the video samples supplied from the output charge sensing state of said CCD imager.

2. A CCD imager comprising:
   an image register, which includes a plurality of parallelled CCD charge transfer channels for successively transporting charge packets formed by photoconverting image elements of a radiant energy image, which charge transfer channels have respective output ports parallelly aligned with each other;

a line selector sequentially dynamically clocking said parallelled image register charge transfer channels thereby to provide for sequential scanning of lines of charge packets representative of the intensities of said image elements from said image register, said sequential dynamic clocking being for substantially full line duration length of time for each sequential line selection to cause the line selection artifacts to occur in portions of the line scan intervals defining in the time domain a spatial band normal to the direction of line scan and narrower than that spatial band associated with a line retrace interval;

a charge funnel having an input port to which the parallelly aligned output ports of said image register charge transfer channels connect and having an output port;

a charge sensing stage having an input port for receiving charge packets serially supplied thereto and having an output port for supplying samples of a video signal responsive respectively to those serially received charge packets; and a CCD shift register having an input port connected to the output port of said charge funnel, having an output port connected to the input port of said charge sensing stage, and augmenting the time delay between said image register and said charge sensing stage for placing said spatial band in which line selection artifacts occur within that portion of the time domain defined by the line retrace intervals in the video samples supplied from said charge sensing stage.

3. A CCD imager according to claim 2, wherein:
said CCD shift register exhibits a delay between its input and output ports which equals a full line duration less the delay exhibited by said charge funnel.

4. A CCD imager comprising:
an image register, which includes a plurality of parallelled CCD charge transfer channels for successively transporting charge packets formed by photoconverting image elements of a radiant energy image, which charge transfer channels have respective output ports in a parallel alignment with each other;

a line selector sequentially dynamically clocking said parallelled image register charge transfer channels thereby to provide for sequential scanning of lines of charge packets representative of the intensities of said image elements from said image register, said sequential dynamic clocking being for substantially full line duration length of time for each sequential line selection to cause the line selection artifacts to occur in a portion of the line scan intervals defining in the time domain a spatial band normal to the direction of line scan and narrower than that spatial band associated with a line retrace interval;

a plurality of charge funnels, having respective input ports in parallel alignment with each other and the parallel alignment of the output ports of the charge transfer channels in said image register, and having respective output ports;

a charge sensing stage having an input port for receiving charge packets serially supplied thereto and having an output port for supplying samples of a video output signal respectively responsive to those serially received charge packets;

a delay and merge CCD structure, having a plurality of input ports to which the output ports of said plurality of charge funnels respectively connect, having an output port connected to the input port of said charge sensing stage, and exhibiting equal delays between each of its input ports and its output port, those delays being of a value for augmenting the time delay between said image register and said charge sensing stage for placing said spatial band in which line selection artifacts occur in a portion of the corresponding time domain that is within that portion of the time domain defined by the line retrace intervals in the video sampled supplied from said output charge sensing stage.

5. A CCD imager comprising:
an image register, which includes a plurality of parallelled CCD charge transfer channels for successively transporting charge packets formed by photoconverting elements of a radiant energy image, which charge transfer channels have respective output ports in a parallel alignment with each other;

a . line selector sequentially dynamically clocking said parallelled image register charge transfer channels, thereby to provide for sequential scanning of lines of charge packets representative of the intensities of said image elements from said image register;

a CCD shift register, having a plurality of charge transfer stages side-loaded from respective output ports of the image register charge transfer channels, having an output port, and exhibiting differential delay between its various side-loaded charge transfer stages and its output port;

a variable-length CCD delay line, having an input port to which the output port of said CCD shift register connects, having an output port connected to an input port of said charge sensing stage, and being operable to compensate for the differential delay in said CCD shift register; and means for progressively adjusting the length of said variable-length CCD delay line scanning line by scanning line.

6. A variable-length CCD delay line comprising:
first and second charge transfer channels in parallel juxtaposition for transferring charge packets in a first direction and in a second direction respectively, which first and second directions are opposite to each other;

a first succession of storage gate electrodes crossing said first charge transfer channel and receptive of two-phase clocking voltage for inducing storage wells under alternate ones of those storage gate electrodes;

a second succession of storage gate electrodes crossing said second charge transfer channel and receptive of two-phase clocking voltages for inducing storage wells under alternate ones of those storage gate electrodes in parallel juxtaposition with the storage wells induced under alternate ones of the gate electrodes in said first succession;

means for erecting a respective energy barrier between each pair of successive gate electrodes in said first succession respective to the potential energy level under the storage gate electrode following the barrier in said first direction;

means for erecting a respective potential energy barrier, between each pair of successive storage gate electrodes in said second succession respective to the potential energy level under the storage gate electrode following the barrier in said second direction, and between the storage gate electrode in said second succession following the barrier in said second direction and the parallelly juxtaposed storage gate electrode in said first succession;

means for introducing charge packets under the initial storage gate electrode in said first succession;

means for transferring charge packets from under the final storage gate electrode in said second succession; and means increasing the potential applied to a selected one of the storage gate electrodes in said second succession for controlling the length of said variable length delay line.

7. A variable-length CCD delay line as set forth in claim 6 included in a CCD imager of line transfer type which further includes:

an image register with a plurality of parallelled CCD charge transfer channels for successively transporting charge packets formed by photoconverting elements of a radiant energy image, which charge transfer channels have respective ouput ports in parallel alignment with each other;

a CCD shift register, having a plurality of charge transfer stages side-loaded from respective output ports of the image register charge transfer channels, and having an output port connected for introducing charge packets under the initial storage gate electrode in said first succession;

a charge sensing stage having an input port to which charge packets are transferred from under the final storage gate electrode in said second succession in a spatial band normal to the direction of line scan no wider than that spatial band as would be associated with the line retrace interval; and a line selector sequentially dynamically clocking said parallelled image register charge transfer channels no more than two at a time, so as to provide for sequential scanning of lines of charge packets representative of the intensities of said image elements from said image register with offsets compensating for the delays in said CCD shift registers.

8. A CCD imager of line-transfer type comprising:

an image register with a number of parallelly arranged charge transfer channels with respective output ports, said charge transfer channels each comprising a succession of charge transfer stages for accumulating charge packets descriptive of respective elements of a radiant energy image impinging on said parallelly arrayed charge transfer channels;

means for applying forward clocking signals to selected ones of the charge transfer channels in said image register, selection being made according to a predetermined line scanning pattern;

a charge sensing stage having an input port and having an output port for delivering video signal samples indicative of the amplitudes of charge packets received at its input port; and an output register having an output port, having input port means for receiving input charge packets from the output ports of each of the charge transfer channels in said image register, and having means for delaying the passage of each charge packet between its introduction through said input port means and its exit through the output port of said output register to the input port of said charge sensing stage, said means for delaying providing delay of duration that is in a range between a positive multiple of full line duration and that multiple as augmented by a line retrace interval.

9. A CCD imager of line transfer type as set forth in claim 8 wherein said positive multiple of full line duration is one full line duration.

* * * * *